(12) United States Patent
Madsen et al.

(10) Patent No.: US 7,301,623 B1
(45) Date of Patent: Nov. 27, 2007

(54) TRANSFERRING, BUFFERING AND MEASURING A SUBSTRATE IN A METROLOGY SYSTEM

(75) Inventors: Jonathan M. Madsen, Sunnyvale, CA (US); Jiangtao Hu, Alameda, CA (US); Christopher W. Blaufus, San Jose, CA (US)

(73) Assignee: Nanometrics Incorporated, Milpitas, CA (US)

( * ) Notice: Subject to any disclaimer, the term of this patent is extended or adjusted under 35 U.S.C. 154(b) by 344 days.

(21) Appl. No.: 10/738,190

(22) Filed: Dec. 16, 2003

(51) Int. Cl.
*G01N 21/00* (2006.01)
*A61N 5/00* (2006.01)

(52) U.S. Cl. .................... 356/244; 356/630; 356/635; 250/492.2

(58) Field of Classification Search ............... 356/244, 356/600–601, 630, 635; 250/442.11, 441.11; 269/21, 47; 324/765; 279/128, 155; 361/233–234; 73/865.9; 414/609, 222, 935, 217, 214; 118/715, 728
See application file for complete search history.

(56) References Cited

U.S. PATENT DOCUMENTS

| | | | | |
|---|---|---|---|---|
| 4,006,909 A | * | 2/1977 | Ollendorf et al. .............. 279/3 |
| 4,624,728 A | * | 11/1986 | Bithell et al. .......... 156/345.47 |
| 4,724,222 A | * | 2/1988 | Feldman .................. 250/492.2 |
| 5,118,955 A | * | 6/1992 | Cheng .................... 250/559.23 |
| 5,232,547 A | | 8/1993 | Drowley et al. ............ 156/601 |
| 5,658,700 A | * | 8/1997 | Sakai .......................... 430/30 |
| 5,815,366 A | * | 9/1998 | Morita et al. ............... 361/234 |
| 5,823,736 A | * | 10/1998 | Matsumura ................. 414/609 |
| 5,848,670 A | * | 12/1998 | Salzman ..................... 187/272 |
| 5,997,962 A | * | 12/1999 | Ogasawara et al. ........ 427/535 |
| 6,160,615 A | * | 12/2000 | Matsui et al. ............ 356/237.4 |
| 6,168,668 B1 | * | 1/2001 | Yudovsky ................... 118/715 |
| 6,403,322 B1 | * | 6/2002 | Fischer .......................... 435/6 |
| 6,403,933 B1 | * | 6/2002 | Strodtbeck et al. ......... 219/502 |
| 6,481,723 B1 | * | 11/2002 | Hao et al. ................... 279/128 |
| 6,608,689 B1 | | 8/2003 | Wei et al. ................... 356/630 |
| 6,646,857 B2 | * | 11/2003 | Anderson et al. ........... 361/234 |

(Continued)

FOREIGN PATENT DOCUMENTS

JP   2003-197721   7/2003

OTHER PUBLICATIONS

"Rudolph Technologies' New Wafer-Bow/Stress Metrology Tool is Designed for High-Volume Semiconductor Manufacturing", Oct. 16, 2003, 3 pages.

*Primary Examiner*—Sang H. Nguyen
(74) *Attorney, Agent, or Firm*—Silicon Valley Patent Group LLP

(57) ABSTRACT

A chuck that clamps a substrate to the top surface using, e.g., a vacuum, electrostatic force, or other appropriate means, includes a plurality of lift pins that can raise the substrate off the top surface of the chuck. The chuck may be used with a metrology device that measures the substrate using a first type of measurement, e.g., film thickness measurement, while the substrate is held flat, and measures the substrate using a second type of measurement, e.g., radius of curvature measurement, while the substrate is supported on the lift pins. The thickness and radius of curvature measurements may then be used to determine the stress on the substrate. The lift pins may include an aperture through which a vacuum is applied through the top surface of the lift pins to the bottom of the substrate to securely hold the substrate while moving.

30 Claims, 12 Drawing Sheets

U.S. PATENT DOCUMENTS

| | | | |
|---|---|---|---|
| 6,650,135 B1 * | 11/2003 | Mautz et al. | 324/765 |
| 6,722,642 B1 * | 4/2004 | Sutton et al. | 269/21 |
| 6,750,950 B1 * | 6/2004 | Miyachi | 355/55 |
| 6,875,987 B2 * | 4/2005 | Kondo | 250/442.11 |
| 6,938,505 B2 * | 9/2005 | Chen et al. | 73/865.9 |
| 2002/0141133 A1 | 10/2002 | Anderson et al. | 361/234 |
| 2003/0098704 A1 | 5/2003 | Du-Nour et al. | 324/765 |
| 2003/0175145 A1 | 9/2003 | Anderson et al. | 156/345.51 |
| 2005/0126315 A1 * | 6/2005 | Hunter | 73/865.9 |

* cited by examiner

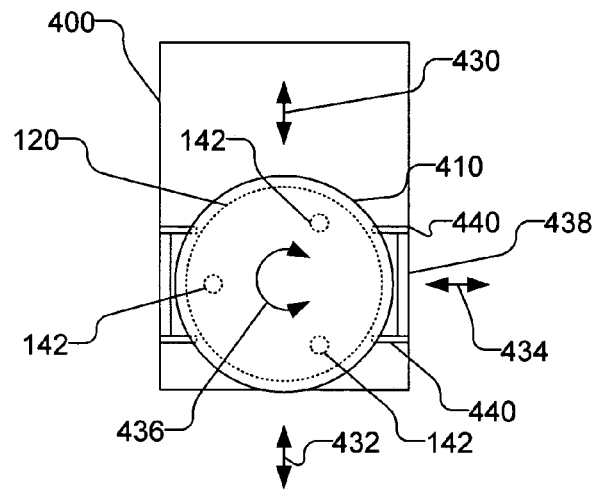 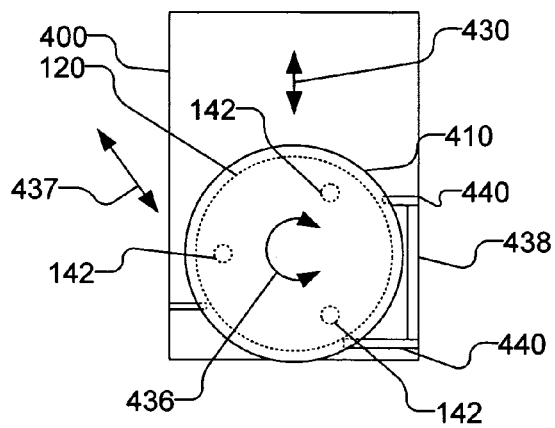
Fig. 18A          Fig. 18B
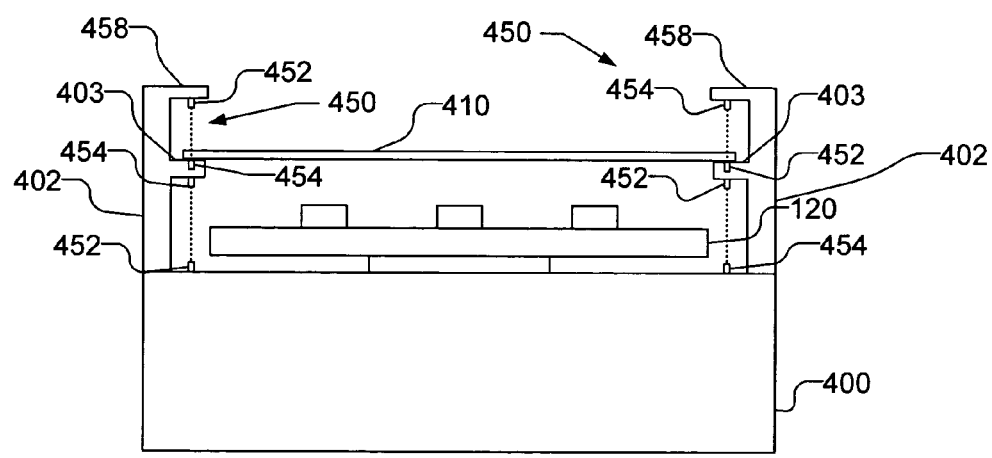
Fig. 19

TRANSFERRING, BUFFERING AND MEASURING A SUBSTRATE IN A METROLOGY SYSTEM

FIELD OF THE INVENTION

The present invention relates to metrology and in particular to transferring and holding a substrate during a metrology process.

BACKGROUND

Flat substrates, such as semiconductor wafers, are stressed during certain processing steps, e.g., depositing or etching thin films. Stress in deposited layers can warp the substrate, which can adversely affect subsequent process steps, device performance, reliability and line-width control. Thus, it is desirable to measure the radius of curvature of a substrate as well as measure the stress on a substrate that is associated with a processing step.

There are many measurement tools available for measurement of the radius of curvature and analysis of the stress associated with certain processing steps on substrates. Most of the available tools for the semiconductor industry use a laser displacement sensor to measure the radius of curvature and to monitor the change in radius of curvature of the wafer before and after the processing step. Generally, radius of curvature is used to describe the bow of the substrate over a larger scale, e.g., the diameter of the substrate.

A laser displacement sensor relies on the reflectance of a laser beam from the surface of the sample to quantify the change in angle of incidence of the beam with respect to the wafer. This information can be transformed into an average radius of curvature for an entire diameter of a wafer or an average radius of curvature for a fraction of a diameter allowing the calculation of stress as a function of position along the diameter. This measurement can be repeated at a number of locations within a diameter and at a multitude of diameters to create a map of the stress over an entire wafer.

During the radius of curvature measurement, the substrate is typically placed on a stress-free chuck. FIG. 1 is a perspective view of a conventional stress-free chuck 10 with three pins 12 that support a substrate 14 (illustrated with broken lines). FIG. 2 is a side view of chuck 10 and pins 12 support substrate 14, which has been deposited with a thin film 16. The bowing of substrate 14 is shown greatly exaggerated in FIG. 2 for illustrative purposes. The radius of curvature of the substrate 14 prior to and after the deposition of the film 16 can be compared and converted into the stress in the film σ using the bending plate method as follows:

$$\sigma = \frac{1}{6} * \left[\frac{1}{R_{post}} - \frac{1}{R_{pre}}\right] * \frac{E}{(1-n)} * \frac{t_s^2}{t_f} \quad \text{eq. 1}$$

where σ is the stress in the film, R is the radius of curvature (pre and post deposition), E is Young's modulus, n is Poisson's ratio, $t_s$ is the substrate thickness, and $t_f$ is the film thickness.

As can be seen in equation 1, in order to determine the stress in the film, the thickness of the film must also be measured. Thickness measurements are preferably made on a flat substrate, e.g., with the substrate held flat with a vacuum chuck. Thus, thickness measurements are sometimes made at a separate metrology station than the radius of curvature measurement, which uses a stress-free chuck.

In order to increase throughput, however, the thickness of the film on the substrate is sometimes measured while the substrate is on the stress-free chuck 10. As illustrated in FIG. 3, the bowing of the substrate 14 (only a portion of which is shown) will cause the light 18 to be incident at a non-normal angle θ, which is dependent on the amount of bowing of the substrate and, thus, is an uncontrolled parameter. Accordingly, the angle of incidence of the light from the metrology instrument must be included as fit parameter, which slows calculation and is somewhat inaccurate. Additionally, while the substrate 14 is held on the stress-free chuck 10, the substrate 14 is subject to vibrations, which can create errors in the thickness measurement.

Thus, what is needed is an improved system that can accurately hold and measure a substrate in multiple orientations, i.e., flat and stress-free without using separate metrology stations.

SUMMARY

In accordance with an embodiment of the present invention, a chuck clamps a substrate to the top surface using, e.g., a vacuum, electrostatic force, or other appropriate means, during a first type of measurement, and raises the substrate off the top surface of the chuck on a plurality of lift pins during a second type of measurement. Accordingly, the substrate can be held flat during a film thickness measurement and then can be raised on pins to reduce undesirable forces on the substrate during a radius of curvature measurement. Thus, the substrate does not need to be loaded onto to different metrology stages for the different measurements.

In one embodiment of the present invention, a method includes loading a substrate on a chuck, holding the substrate flat on a top surface of the chuck during a first type of measurement of the substrate, and raising a plurality of pins from the top surface of the chuck to raise the substrate on the plurality of pins during a second type of measurement of the substrate. The first type of measurement may be a thickness measurement of a film on the substrate and the second type of measurement may be a radius of curvature measurement of the substrate, which are used to calculate the stress on the substrate. The act of holding the substrate flat may be performed by providing a vacuum to the backside of the substrate through the top surface of the chuck, e.g., through at least one channel. In addition, a vacuum may be applied to the top surfaces of the plurality of pins before raising the plurality of pins to hold the substrate to the plurality of pins, where the vacuum is removed before performing the second type of measurement of the substrate.

In another embodiment of the present invention, an apparatus includes a chuck having a top surface and a means for holding a substrate flat on the top surface of the chuck. The chuck also includes a plurality of pins that movably extend through the top surface of the chuck to raise a substrate off the top surface of the chuck and at least one actuator coupled to the plurality of pins, where the at least one actuator raises and lowers the plurality of pins through the top surface of the chuck. The means for holding a substrate flat may be, e.g., an aperture that communicates with the top surface through which a vacuum is applied. The apparatus may further includes an actuator that is coupled to the chuck and is used to raise and lower the chuck. The apparatus may further include a metrology device that produces a first type of measurement of a substrate held flat on the top surface of the chuck and a second type of measurement of the substrate raised on the pins off the top surface of the chuck.

In yet another embodiment of the present invention, a method includes loading a substrate on a chuck having a top surface and a plurality of vertically movable pins, providing a vacuum to at least a portion of the backside of the substrate through the top surface of the chuck to hold the substrate flat on the top surface of the chuck, and measuring the thickness of a film on the substrate while the substrate is held flat on the substrate. The method also includes removing the vacuum to the at least a portion of the backside of the substrate through the top surface of the chuck, providing a vacuum to at least a portion of the backside of the substrate through the top surfaces of the plurality of pins, and raising the plurality of pins to raise the substrate off the top surface of the chuck. The method further includes removing the vacuum to the at least a portion of the backside of the substrate through the top surfaces of the plurality of pins; and measuring the radius of curvature of the substrate while the substrate is supported on the plurality of pins. The act of measuring the radius of curvature may include measuring the height of the top surface of the substrate at a plurality of locations while the substrate is supported on the plurality of pins.

BRIEF DESCRIPTION OF THE DRAWINGS

FIGS. 18A and 18B illustrate various directions for loading a substrate on the chuck and buffer.

FIG. 19 illustrates a front view of chuck with buffers and substrate sensors, in accordance with another embodiment of the present invention.

DETAILED DESCRIPTION

In accordance with an embodiment of the present invention, a chuck holds a substrate flat, e.g., using a vacuum, for film thickness measurements, and holds the substrate on raised pins for radius of curvature measurements, which may be used, e.g., to determine stress. The chuck is used with a metrology device that is capable of measuring both the thickness of the film as well as the curvature of radius of the substrate.

Figure 1:
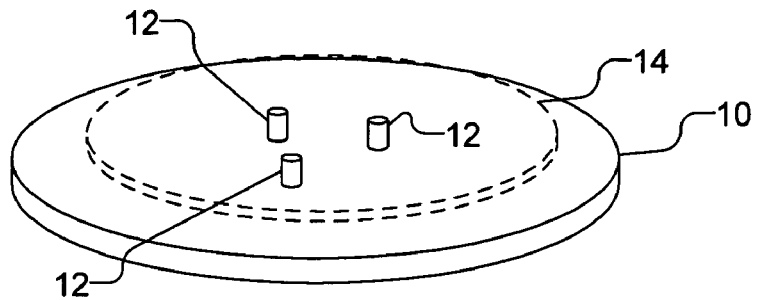
FIG. 1 is a perspective view of a conventional stress-free chuck with three pins that support a substrate.
Figure 2:
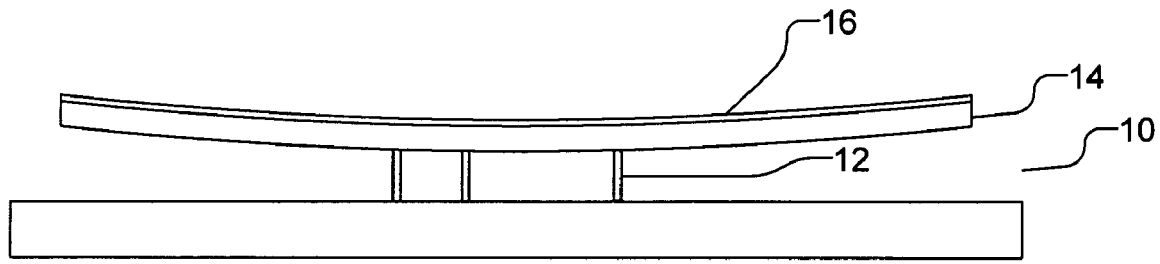
FIG. 2 is a side view of a conventional stress-free chuck and pins that support a substrate.
Figure 3:
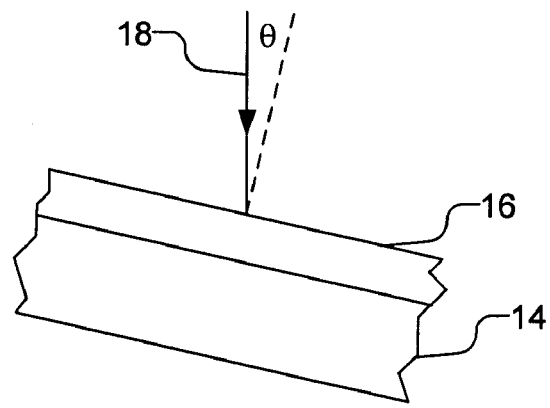
FIG. 3 is a side view of a bowed substrate being measured with incident light that is at a non-normal angle.
Figure 4:
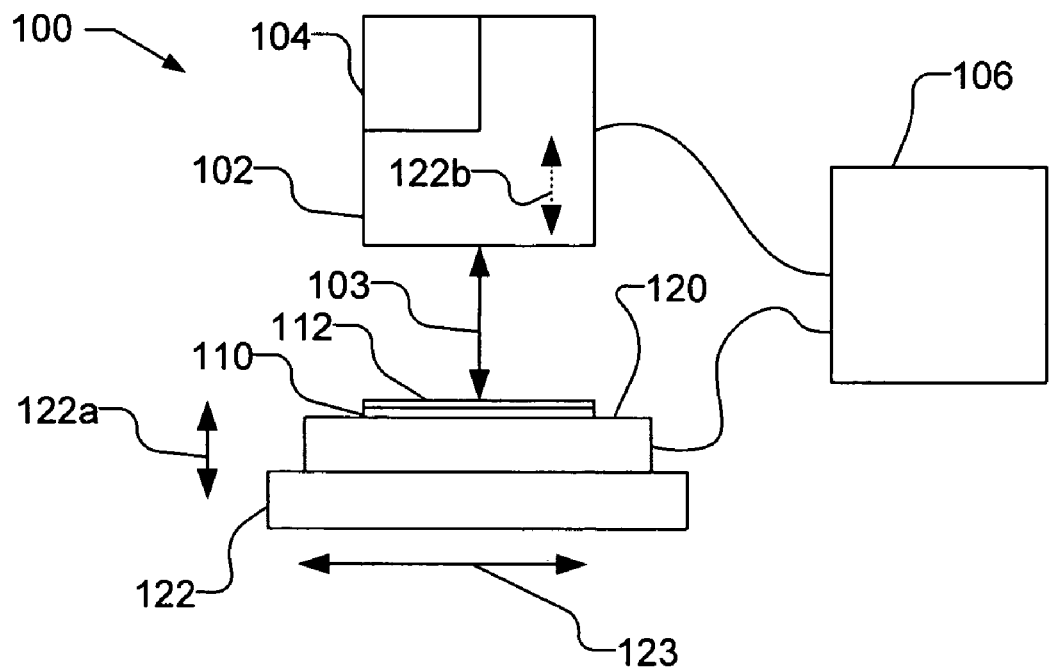
FIG. 4 shows a schematic view of a metrology tool that includes a chuck that can hold the substrate flat as well as raise the substrate on lift pins.

FIG. 4 shows a schematic view of a metrology tool 100 that may be used to measure the radius of curvature of a substrate 110 as well as the thickness of a film or film stack 112 on the substrate 110. For the sake of convenience, film and film stack will be used interchangeably herein. The metrology tool 100 can then calculate the stress on the substrate. The metrology tool 100 includes chuck 120 mounted on a stage 122. The stage 122 is capable of vertical motion, as indicated by arrow 122a. The stage 122 is also capable of horizontal motion in either Cartesian (i.e., X and Y) coordinates, as indicated by arrows 122a and 123, or Polar (i.e., R and θ) coordinates or some combination of the two.

Metrology tool 100 includes an optical head 102 that includes a focusing system 104 and is coupled to a processor 106. The processor 106 may control the movement of the stage 122 (or optical head 102) as well as control the operation of the chuck 120 as will be explained below. In one embodiment, the chuck 120 may be held stationary while the optics move relative to the substrate 110 or both may move relative to the other. For example, the optical head 102 or a portion of the optical head 102, e.g., an objective lens, may be movable in the vertical direction, as indicated by arrow 122b.

As illustrated in FIG. 4, the optical head 102 is positioned generally above the substrate 110 so that the measurement beam 103 is normal to the surface of the sample 110. It should be understood that measurement beam 103 may be specifically for the focusing system 104 or may be a shared optical path for other systems in the metrology tool, e.g., for a reflectometer, ellipsometer, scatterometer or the like. For example, broadband light may be used to focus as well as provide a signal for a reflectometer. If desired, a separate laser system could be used only for focusing, where it shares the same optical path as the measurement illumination. The optical head 102 includes an objective lens with a known focal length. Thus, when the surface of the sample 110 is in focus, the distance between the objective lens and the surface of the sample is known.

In operation, the metrology tool 100 can measure the thickness of a film 112 on the substrate 110 using a conventional means, such as reflectometery, ellipsometry or other appropriate device. Measuring the thickness of a film is well known to those skilled in the art. The metrology tool 100 uses the focusing system 104 to measure the radius of curvature of the substrate 110. For example, the stage 122 may move the sample 110 to a plurality of locations and at each location the height of the substrate 110 is measured using the focusing system 104. The height of the substrate 110 can be determined based on the amount of vertical movement necessary to place the top surface of the sample in focus, where the distance between the objective lens and the surface of the sample is known. With the height of the substrate 110 determined for a plurality of locations, the radius of curvature of the substrate 110 may be calculated. With the radius of curvature and thickness of the film known, the stress may be calculated according to equation 1.

The processor 106 controls the stage 108, optical head 102 and the focusing system 104 and can place any position on the sample 110 under the optical head 102. The processor 106 also collects and analyzes the data from the stage 122 and optical head 102 to determine the film thickness, radius of curvature, and stress as described above. The processor 106 may be, e.g., a workstation, a personal computer, or central processing unit, e.g., Pentium 4™ or other adequate computer system. The co-owned U.S. patent application entitled "Substrate Surface Profile and Stress Measurement" filed on Sep. 19, 2002, by Jaime Poris and having Ser. No. 10/247,135, describes measuring the thickness and stress of the film and is incorporated herein by reference.

Figure 5:
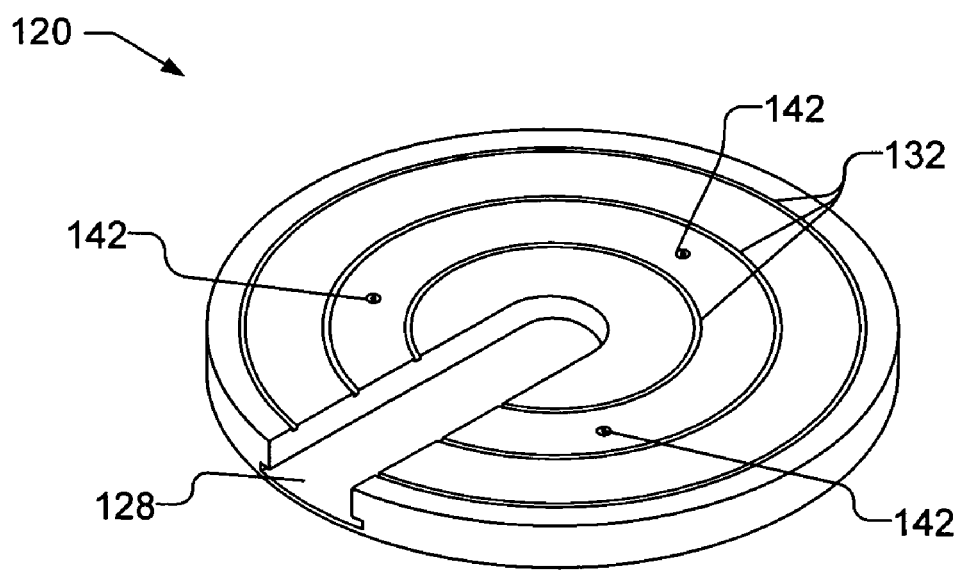
FIG. 5 is a perspective view of a chuck in accordance with an embodiment of the present invention.

FIG. 5 is a perspective view of chuck 120 in accordance with an embodiment of the present invention. Chuck 120 can be used, advantageously, to measure both the thickness and radius of curvature (or stress) of a substrate (not shown in FIG. 5).

As illustrated in FIG. 5, chuck 120 includes a plurality of channels 132 through which a vacuum may be applied to the back side of a substrate resting on the surface of the chuck. The vacuum ensures that the substrate lies flat during a thickness measurement, thereby avoiding difficulties associated with non-normally incident light. Further, holding the substrate flat prevents vibration of the substrate during measurement. If desired, chuck 120 may use other means for holding the substrate 110 flat during thickness measurements, such as an electrostatic force, which is well known in the art.

Chuck 120 also includes lift pins 142, shown retracted in FIG. 5. Lift pins 142 are used to lift a substrate off the top surface of the chuck 120 and support the substrate at a minimum of contact points to permit an accurate measurement of radius of curvature on the substrate.

Chuck 120 further includes a slot 128 that extends from the perimeter of the chuck 120 to the center of the chuck 120. The slot 128 allows access for a paddle (not shown) to place and retrieve a substrate on the top surface of the chuck 120.

Figure 6A:
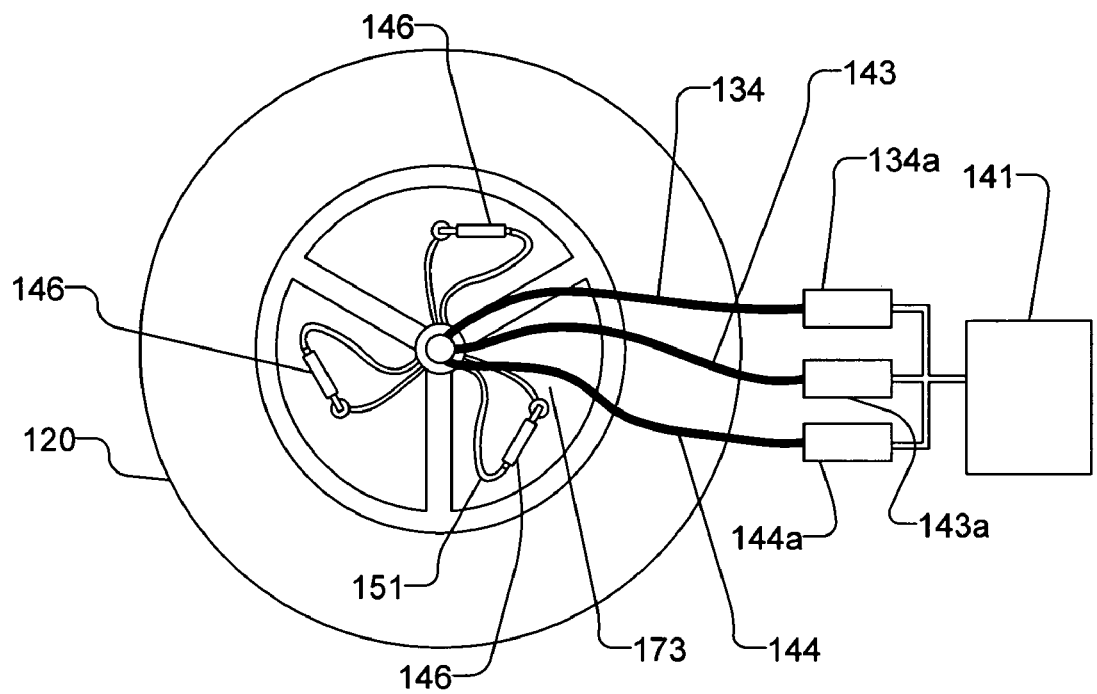
FIG. 6A illustrates the bottom side of chuck along with the pneumatic actuators that control the movement of the lift pins.

FIG. 6A illustrates the bottom side of chuck 120. Chuck 120 includes three air inlets 134, 143, and 144 that are coupled to the center of the chuck. The inlets 134, 143, and 144 are coupled to independent, low particulate, high flow solenoid valves 134a, 143, and 144, respectively, which are coupled to a single vacuum source 141. The solenoid valves 134a, 143a, and 144a are coupled to and controlled by, e.g., the processor 106 shown in FIG. 4. In order to achieve a rapid response time, high flow valves should be used along with vacuum channels that have a minimum volume.

Inlet 134 is coupled to the channels 132 and is used to provide a vacuum to the back side of a substrate on the chuck 120 to hold a substrate flat during the thickness measurement. Providing a vacuum through channels on the top surface of a chuck to form a vacuum clamp is well known in the art.

Inlet 143 is coupled to vacuum controlled pneumatic actuators 146, which are used to raise and lower lift pins 142. Inlet 144 is coupled to the lift pins 142 and is used to provide a vacuum to the top surface of the lift pins 142.

Figure 6B:
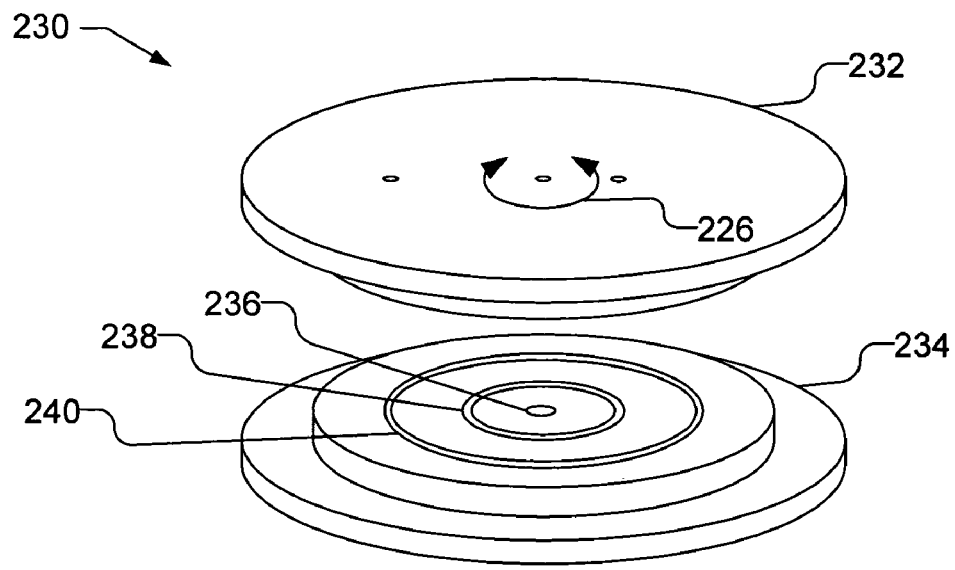
FIGS. 6B and 6C illustrate a perspective view and cross sectional view, respectively, of a rotary pneumatic feedthrough.
Figure 6C:
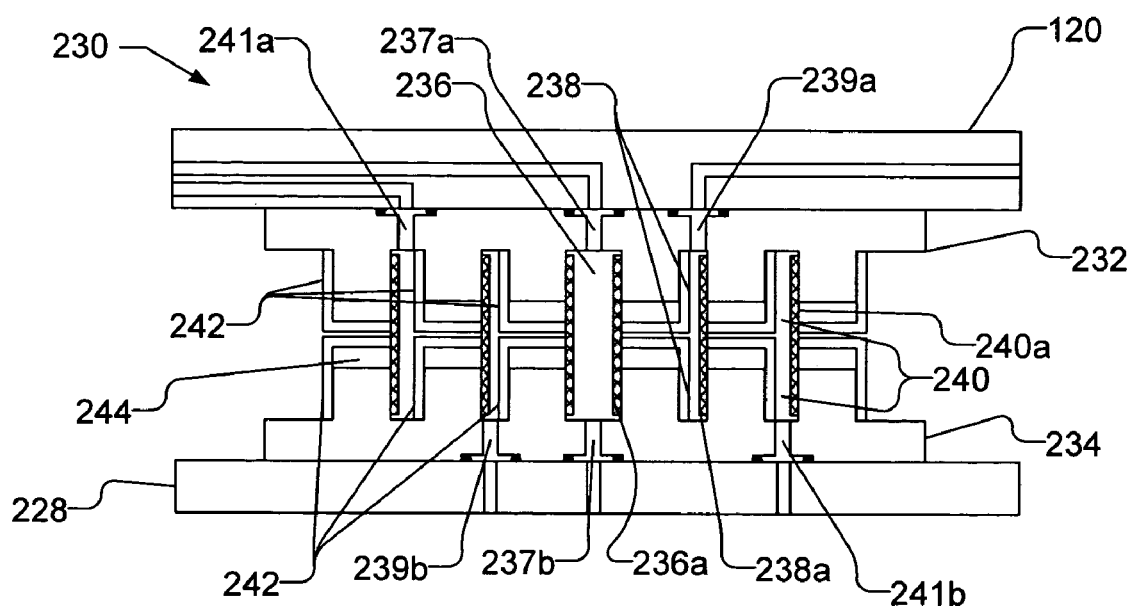

The inlets 134, 143, and 144 are coupled to the center of the chuck 120 through a rotary pneumatic feedthrough, which permits a vacuum, or pressurized air, to be delivered to the chuck 120 while chuck 120 rotates. FIGS. 6B and 6C illustrate a perspective view and cross sectional view, respectively, of a rotary pneumatic feedthrough 230, which may be used with the present invention. Feedthrough 230 includes a top element 232 and a bottom element 234, which are rotatably coupled. FIG. 6B illustrates top element 232 and bottom element 234 separate by a large distance for clarity. FIG. 6C illustrates a portion of the chuck 120 mounted to the top element 232 and a portion of a base 228 to which is mounted the bottom element. The top element 232 (and chuck 120) rotates with respect to the bottom element 234 (and base 228) as indicated by the arrow 226 in FIG. 6C. The top element 232 and bottom element 234 may be mounted to the chuck 120 and base 228, respectively, with bolts, rivets, epoxy, or any other appropriate mounting mechanism.

The rotary feedthrough 230 is centered on the bottom side of the chuck 120. An outer cylinder (not shown) may be used to couple the base 228 to the chuck 120, where the feedthrough 230 is inside the outer cylinder. The base 228 may be coupled to or part of a rotary driver to rotate the chuck 120, via the cylinder. The rotary driver may be mounted on a vertical driver (not shown), that moves the rotary driver and chuck 120, via the cylinder, in the vertical direction. The top element 232 thus moves with the chuck 120 while the bottom element 234 may remain stationary with the rotary driver. A horizontal driver may be used to move the vertical driver, the rotary driver, feedthrough 230 and chuck 120, or the optics, or both, in the horizontal direction.

The top element 232 and bottom element 234 include grooves 236, 238 and 240, which extend partially through the elements. Groove 236 may be, e.g., a hole in the center of the top element 232 and bottom element 234. Apertures 237a, 239a, and 241a are provided through the top element 232 to the grooves 236, 238, and 240, respectively, and apertures 237b, 239, and 241b are provided through the bottom element 234 to the grooves 236, 238, and 240, respectively. Apertures may pass through the chuck 120 and base 228 to the apertures in the top and bottom elements, as illustrated in FIG. 6C, where the connections are sealed with O-rings. As illustrated in FIG. 6C, grooves 236, 238 and 240 may be formed by a plurality of metal plates 242 and the material of the top element 232 or bottom element 234. Seal element 236a, 238a, and 240a is retained within the grooves 236, 238, and 240 of the top and bottom elements. The seal elements 236a, 238a, and 240a prevent the vacuum from escaping (or pressurized air, if used).

In general, the top and bottom elements 232 and 234 may be manufactured from aluminum or other appropriate material. The metal plates 242 may be manufactured from aluminum. The seal elements 236a, 238a, and 240a may be manufactured from, e.g., plastic or rubber. The top element 232 and bottom element 234 are held a fixed distance apart, while the top element 232 rotates with the chuck and the bottom element 234 may not rotate. It should be understood that while three grooves 236, 238, and 240 are illustrated in FIGS. 6B and 6C, additional grooves may be used to provide additional pneumatic lines to the chuck 120. Of course, it should be understood that if desired, other feedthrough designs may be used. The design of an adequate feedthrough is well within the abilities of those skilled in the art.

Figure 7:
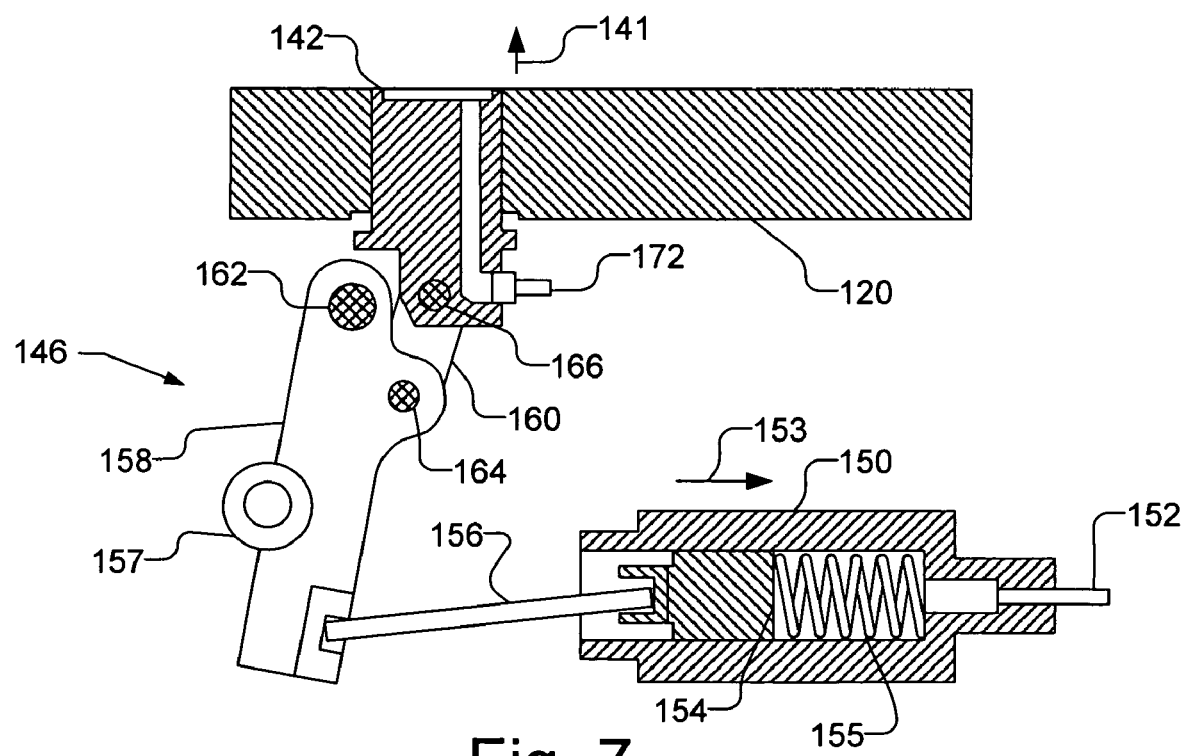
FIG. 7 shows a cross-sectional view of a lift pin and a pneumatic actuator.

FIG. 7 shows a cross-sectional view of a lift pin 142 and a pneumatic actuator 146. As illustrated in FIG. 7, pneumatic actuator 146 includes a cylinder 150 with an inlet 152 that is coupled to the inlet 143 shown in FIG. 6 by a suitable conduit 151 shown in FIG. 6. A piston cup 154 is slidably coupled inside the pneumatic cylinder 150 and is coupled to an arm 156. The other end of the arm 156 is coupled to a lever 158 which is coupled to the lift pin 142 via another arm 160. The lift pin 142 is shown set within a portion of the chuck 120.

When a vacuum is applied to the cylinder 150 the piston cup 154 slides horizontally in the direction of arrow 153. The horizontal movement of the piston cup 154 rotates lever 158 about a shaft 162. The rotation of lever 158 is converted into the vertical motion of lift pin 142, as indicated by arrow 141, via arm 160, which is connected to lever 158 at shaft 164 and lift pin at shaft 166. A stop 157 prevents lever 158 from over rotating. The cylinder 150 is biased, e.g., via a spring 155, to maintain the lift pin 142 in the lowered position.

The lift pin 142 includes an inlet 172 that is coupled to the inlet 144 shown in FIG. 6 by a suitable conduit 173 shown in FIG. 6. The inlet 172 permits a vacuum from to be applied to the top surface of lift pin 142.

Figure 8A:
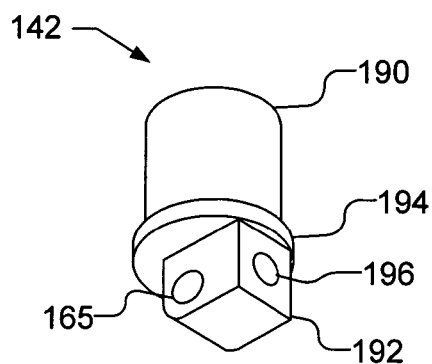
FIGS. 8A and 8B are a perspective view and a front view of a lift pin.
Figure 8B:
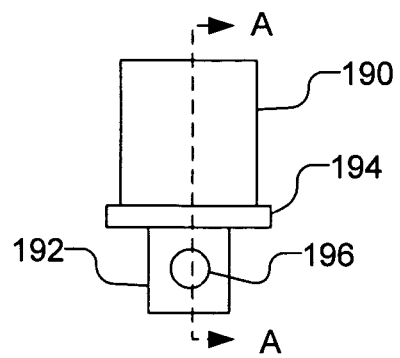
Figure 8C:
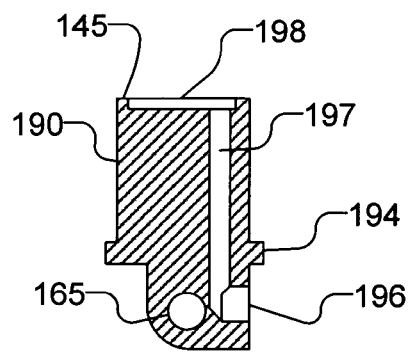
FIG. 8C shows a cross-sectional view of the lift pin along lines AA in FIG. 8B.
Figure 8D:
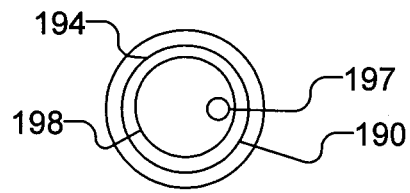
FIG. 8D shows a top view of the lift pin.

FIGS. 8A and 8B are a perspective view and a front view of a lift pin 142. FIG. 8C shows a cross-sectional view of the lift pin 142 along lines AA in FIG. 8B. FIG. 8D is the top view of the lift pin 142.

Lift pin 142 includes a base portion 190 and a connector portion 192, with a flange 194 disposed therebetween. As can be seen in FIGS. 8A-8C, lift pin 142 includes an aperture 165 that extends through the connector portion 192 and through which shaft 166 (shown in FIG. 7) passes. A second aperture 196 is also present in the connector portion 192 and which is coupled to inlet 172 (shown in FIG. 7). Aperture 196 communicates with the top surface 145 of the lift pin 142 by way of another aperture 197. The top surface 145 of the lift pin 142 includes an indentation 198 as illustrated in FIGS. 8B and 8D.

By way of example, lift pin 142 may be 0.8 inches in height with an outside diameter of the base portion 190 of 0.311 inches. The indentation 198 may have a diameter of 0.250 inches and a depth of 0.30 inches. Of course, other dimensions may be used if desired.

Figure 9:
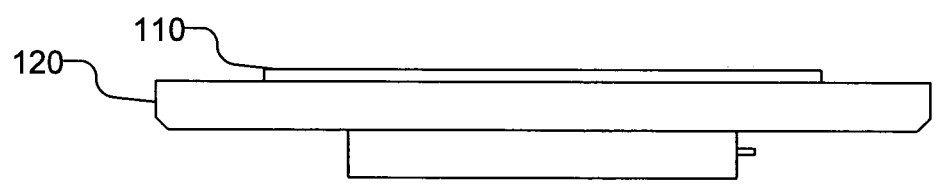
FIGS. 9 and 10 illustrate side views of a chuck with the lift pins and substrate lowered and raised, respectively.
Figure 10:
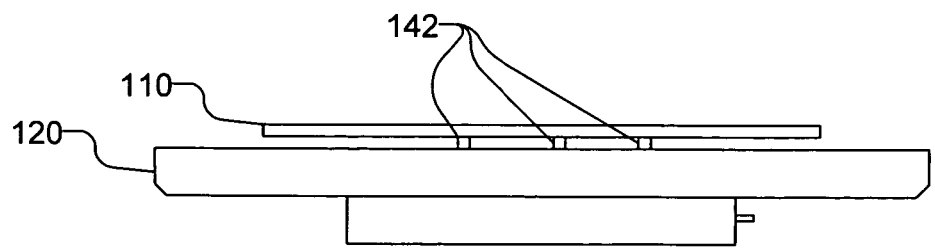

FIGS. 9 and 10 illustrate side views of chuck 120. FIG. 9 shows substrate 110 in a lowered position on the chuck and held flat against the top surface of the chuck 120. FIG. 10 illustrates the substrate being held in a raised position on the chuck 120 on the lift pins 142. In one embodiment, when raised, the lift pins 142 raise the substrate 110 approximately 0.4 inches off the top surface of the chuck 120. Of course, lift pins 142 may raise the substrate 110 any desired amount above the surface of the chuck 120, e.g., 0.1 to 0.8 inches.

In addition, the lift pins 142 should be positioned such that they support the substrate 110 at points that minimize the affect of gravity on the radius of curvature measurement. For example, if the lift pins 142 are located at the outer diameter of the substrate 110, the center of the substrate 110 will be pulled down by gravity. Similarly, if the lift pins 142 are located too near the center of the substrate 110, the substrate 110 will be pulled down at the circumference. Thus, each lift pins 142 should be positioned such that it supports the substrate 110 at a location that is near the center of gravity of the substrate, however, it has been demonstrated that the lift pins 142 can be placed approximately 30% to 70% of the radius of the substrate 110 without compromising the measurement quality.

Figure 11:
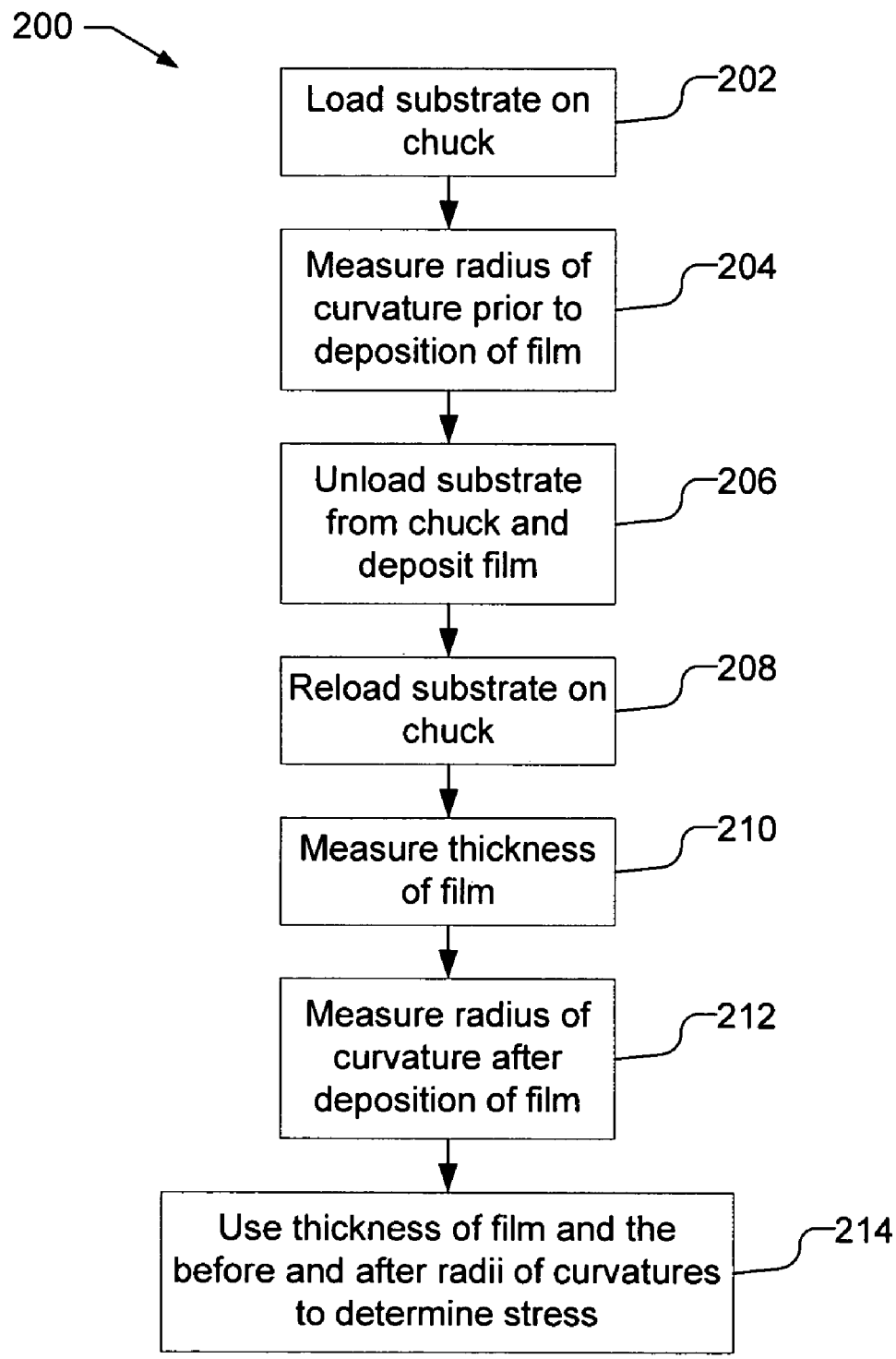
FIG. 11 is a flow chart illustrating the determination of the stress on a substrate using a chuck in accordance with an embodiment of the present invention.

FIG. 11 is a flow chart 200 illustrated the determination of the stress on a substrate using chuck 120. Prior to the film being deposited (or etched) on the substrate, the substrate is loaded onto the chuck 120 (block 202). The radius of curvature of the substrate is then measured (block 204). The operation of the chuck and measuring the radius of curvature of the substrate is discussed in more detail in reference to FIG. 12 below. If desired, the thickness (or other optical parameters) of any layers on the substrate (which will be underlying the to-be deposited film) may be measured.

The film is then deposited on the substrate (block 206) or etched. In some instances, this may require unloading the substrate from the chuck 120 and loading the substrate onto an appropriate deposition or etching stage. Of course, if the metrology tool 100 and chuck 120 are integrated into the deposition tool, the substrate does not need to be unloaded from the chuck 120.

Once the film is deposited (or etched) onto the substrate and the substrate is reloaded on the chuck 120 (block 208) (if necessary), the thickness of the film is measured (block 210). The radius of curvature of the deposited film can then be measured (block 212). Using the thickness of the film as well as the before and after radii of curvature of the substrate, the stress on the substrate may be determined (block 214), e.g., using equation 1 above.

Because the same chuck is used for both the thickness measurement and the radius of curvature measurement, there is no need to load and unload the substrate onto different metrology instruments. Accordingly, throughput is increased.

Figure 12:
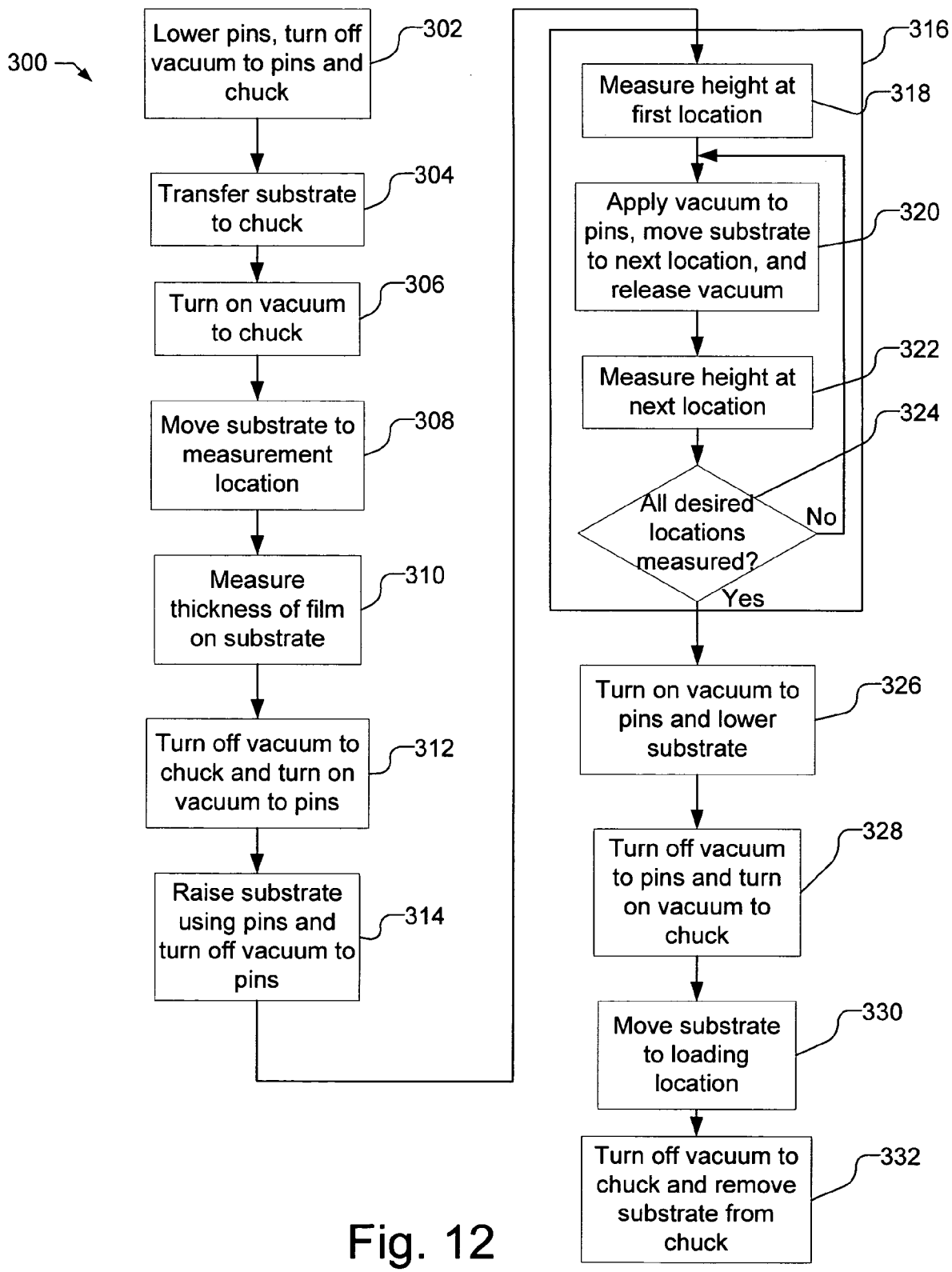
FIG. 12 is a flow chart illustrating the operation of a chuck in accordance with an embodiment of the present invention during the measurement of film thickness and radius of curvature of the substrate.

FIG. 12 is a flow chart 300 illustrating the operation of chuck 120 during the measurement of film thickness and radius of curvature of the substrate. With the lift pins 142 in a lowered position and the vacuum to the lift pins 142 and to the channels 132 turned off (block 302), the substrate is loaded onto the chuck 120 by, e.g., a paddle, and the paddle is removed (block 304). The substrate may be prealigned prior to being loaded onto the chuck 120, or if the metrology tool has the capability, prealignment may occur after the substrate is loaded onto the chuck 120.

The vacuum to the channels 132 of the chuck 120 is then turned on to hold the substrate to the chuck 120 (block 306). The chuck 120 and substrate are then moved to the measurement location, i.e., under the optical head 102, (block 308). It should be understood, of course, that if the chuck 120 is held stationary while the optics are moved, the vacuum to the channels 132 of the chuck 120 only need to be turned on to hold the substrate flat during the thickness measurement.

With the vacuum to the channels 132 of the chuck 120 holding the substrate flat against the chuck, the thickness of the film on the substrate is measured (block 310). Because the substrate is held flat on the chuck 120 during the thickness measurement, the angle of incidence of the light is a known, e.g., the angle of incidence is normal.

The vacuum to the channels 132 of the chuck 120 is then turned off and the vacuum to the lift pins 142 is turned on, which holds the substrate to the lift pins (block 312) as the lift pins 142 are raised. Thus, the substrate is held securely to the lift pins 142 while being raised. After the lift pins 142 are raised, the vacuum to the lift pins 142 is turned off (block 314). Thus, the substrate is gravitationally supported by the lift pins 142 and any unnecessary force and, thus, deformation of the substrate is eliminated.

The radius of curvature measurement of the substrate is then performed (block 316). The radius of curvature of the substrate is measured by measuring the height of the surface of the substrate at a plurality of locations. As described above, and in U.S. Ser. No. 10/247,135, which is incorporated herein by reference, the focus system 104 of the metrology device 100 may be used to determine the height of the surface of the substrate.

Thus, the height of the surface of the substrate is measured at a first location (block 318). By measuring and recording the vertical movement necessary to place the substrate in focus, the height of the surface of the substrate can be determined. The vacuum is then applied to the pins 142 to securely hold the substrate while the substrate is moved to another location under the optics and the vacuum is released (block 320). The height of the surface of the substrate is then measured at the new location (block 322). The process of applying a vacuum to the pins, moving the substrate to a new location, releasing the vacuum, and measuring the height of the substrate at the new location is applied until all desired locations have been measured (block 324). The horizontal movement of the stage 122 to each new location is also saved in the processor and is correlated with the height of the surface of the substrate at that location. The processor 106 can then determine the radius of curvature of the substrate using the measured height for the plurality of locations.

With the radius of curvature measurements performed (block 316), the vacuum to the pins is once again applied and the pins are lowered to place the substrate on the top surface of the chuck (block 326). The vacuum to the pins can then be removed and the vacuum to the channels 132 in the top surface of the chuck 120 is applied. The stage then moves the chuck and substrate to the loading/unloading location (block 330), where the vacuum to the chuck is removed and the substrate is unloaded (block 332).

Using the thickness measurement from step 310 and the radius of curvature measurements from stop 316, the stress from the film may be determined as described above.

It should be understood that while the use of chuck 120 is described in reference to measuring the thickness of a film and the radius of curvature of the substrate, the chuck 120 may be used advantageously where it is desirable to hold a substrate flat during any first type of measurement and to hold the substrate relatively stress-free for any second type of measurement, thereby avoiding the necessity to move the substrate between different metrology stations. Further, the chuck 120 may be used with any device that measures the radius of curvature and, therefore, does not require the use of the described variable focal system to measure the radius of curvature.

Figure 13A:
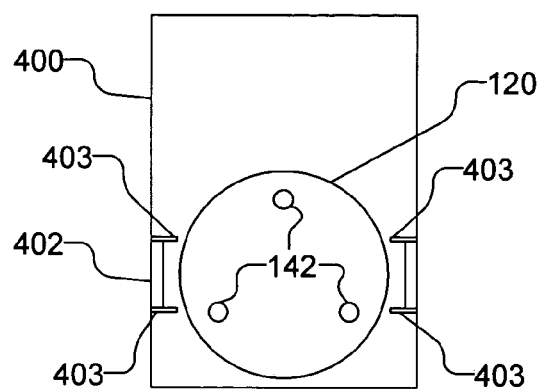
FIGS. 13A, 13B, 14A, 14B, 15A, 15B, 15C, 16A, 16B, 17A, and 17B illustrate the loading and unloading of substrates on a chuck using a buffer.
Figure 13B:
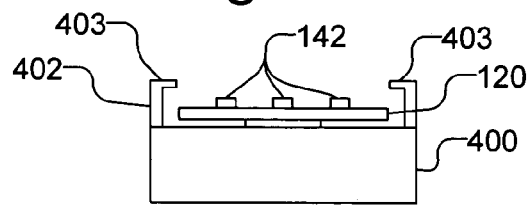

In accordance with another embodiment of the present invention, the lift pins 142 may be used as part of a buffering system to load and unload substrates. FIGS. 13A and 13B, by way of example, illustrate a respective top view and front view of chuck 120 on a base 400 that includes a buffer 402. Buffer 402 may be a static buffer, which includes a plurality of arms 403, such as four arms, which extend horizontally to support a substrate. The arms 403 may be fixedly coupled, e.g., to the base 400 or stationary object. The arms 403 are vertically positioned to hold a substrate at a higher than a substrate held on raised lift pins 142.

Figure 14A:
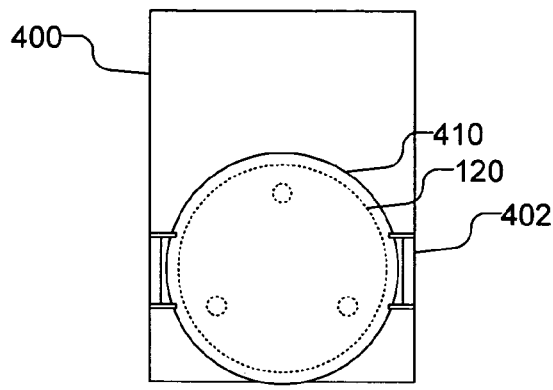
Figure 14B:
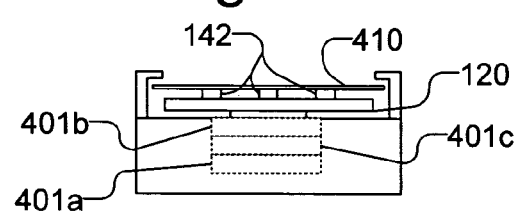

FIGS. 14A and 14B illustrate a respective top view and front view of a substrate 410 placed on the lift pins 142. The chuck 120 and lift pins 142 are shown with broken lines in FIG. 14A because they are covered by substrate 410. The lift pins 142 are in a raised position to accommodate the paddle carrying the substrate 410. Once the substrate 410 is placed on the lift pins 142, the vacuum to the lift pins 142 is turned on and the lift pins are lowered, thereby placing the substrate 410 on the surface of the chuck 120. The vacuum to the lift pins 142 may then be turned off and the vacuum to the chuck 120 turned on.

Figure 15A:
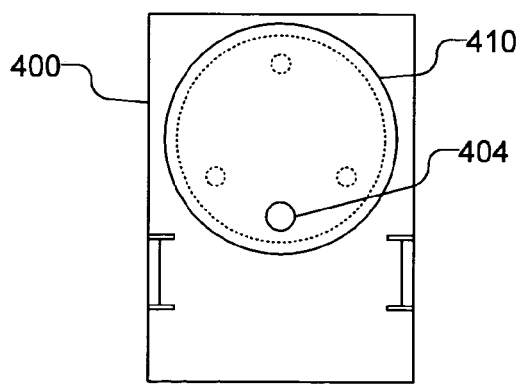

The chuck 120 then moves horizontally with respect to the base 400 to place the substrate 410 under the metrology device 404, illustrated in FIG. 15A as a spot 404. The base 400 operates in the polar coordinates, i.e., R-θ. Thus, the chuck 120 is moved horizontally relative to the base 400 by way of a linear actuator, schematically illustrated in FIG. 14B as box 401a. The chuck 120 is rotated by a rotary actuator, schematically illustrated in FIG. 14B as box 401b. Another linear actuator, schematically illustrated as box 401c, may be used move chuck 120 vertically relative to the base 400.

Figure 15B:
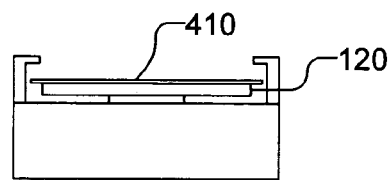
Figure 15C:
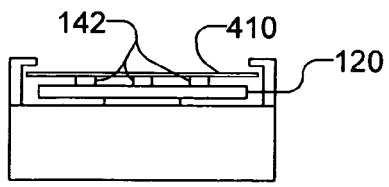

FIG. 15A shows a top view of the substrate 410 positioned to be measured as discussed above. As shown in the front view of FIG. 15B, the substrate 410 may be measured while being held flat on the surface of the chuck 120. The vacuum to the chuck 120 is then turned off, the vacuum to the lift pins 142 is turned on, the lift pins 142 are raised, as illustrated in front view of FIG. 15C, and the vacuum to the lift pins 142 is turned off. While the lift pins 142 are raised the radius of curvature is measured as described above.

Figure 16A:
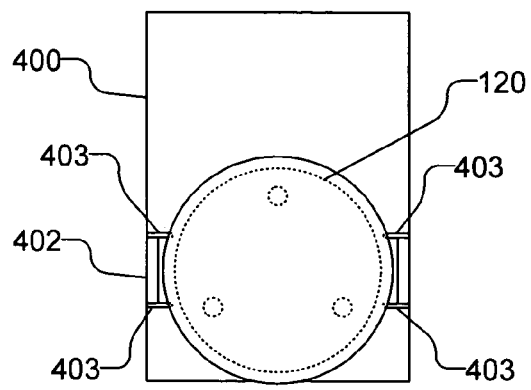
Figure 16B:
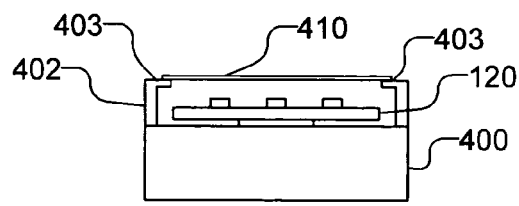

After placing the substrate 410 back on the surface of the chuck 120 and turning on the chuck vacuum, as described above, the chuck 120 is raised and moves horizontally to place the substrate 410 on the arms 402 of the buffer, as illustrated in FIG. 16A. The chuck 120 is then lowered and the lift pins 142 are raised, as illustrated in FIG. 16B.

Figure 17A:
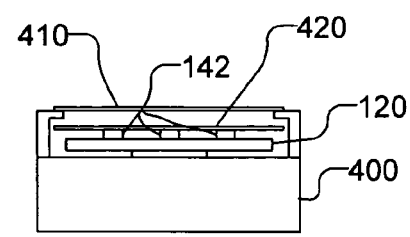
Figure 17B:
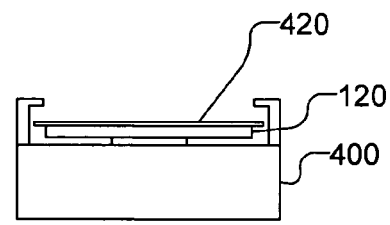

A new substrate 420 is then loaded onto the lift pins 142 as described above. As illustrated in FIG. 17A, however, the first substrate 410 is still held on the buffer 402 when substrate 420 is loaded onto the lift pins 142. The substrate 420 is then moved to be positioned under the metrology device 404, as described above, while substrate 410 is unloaded from the buffer 402, as illustrated in FIG. 17B. The processing of substrates is continued with placing measured substrates on the buffer 402, loading unmeasured substrates on the chuck 120 and unloading the measured substrates from the buffer 402.

In general, a front loading configuration is used, i.e., the substrates are loaded and unloaded onto the chuck 120 in the same direction as the direction of linear motion of the chuck 120. FIG. 18A illustrates the direction of linear motion of chuck 120 with arrow 430, and the direction of motion for a front loading configuration with arrow 432. If desired, however, a side loading configuration may be used, i.e., the substrate is loaded and unloaded onto the chuck 120 in a direction perpendicular to the direction of linear motion of the chuck 120, as illustrated by arrow 434. In a side loading configuration, the buffer 438 includes arms 440 that are spaced apart sufficiently to permit the paddle that is holding the substrate to pass through. The chuck 120 may be rotated, as indicated by arrow 436 so that the lift pins 142 do not interfere with the paddle. In a side loading configuration, the buffering operation is substantially the same as described above.

FIG. 18B is similar to FIG. 18A, but illustrates a configuration in which the substrate is loaded at an angle, i.e., a non-parallel and non-perpendicular angle to the direction of motion of the chuck. By way of example, the substrate may be loaded at approximately 22 degrees to the direction of motion of the chuck 120, as indicated by arrow 437. In order to load at such an angle, the buffer 438a is modified so that there are only three arms, e.g., with two arms 440a on one side of the substrate and one arm 440b on the other side of the substrate. The two arms 440a are also separated by a sufficient distance that the substrate 410 is securely supported. Thus, it can be seen, by appropriate modification of the buffer, the substrate 410 may be loaded onto the chuck 120 at any desired angle.

FIG. 19 illustrates a front view of chuck 120 with buffers 450 in accordance with another embodiment of the present invention. As illustrated in FIG. 19, sensors 450 are used to determine when a substrate 410 is present on the chuck 120 or on the buffer 402. By way of example, through sensors 450 may be through-beam sensors, which include, e.g., a light source 452 and a photodetector 454. Either the light source or the photodetector may be located within the arms 403 of the buffer and the other may be located on an arm 458 that extends above the arm 403. Similarly, a light source 452 or photodetector 454 may be attached to the arm 403 while the other is coupled to the base 400. Thus, if a substrate 410 is located on the buffer 402 or the chuck 120, the beam (shown with a dotted line) will be broken thereby indicating that a substrate is present. As shown in FIG. 19, a plurality of sensors is used at each level, i.e., the buffer level and the chuck level, to aid in the protection of a mis-loaded substrate.

It should be understood that if desired, other types of sensors may be used, such as a vacuum sensor, which measures the presence of a substrate by the level of the vacuum when applied, e.g., through channels 132 or pins 142.

Figure 20:
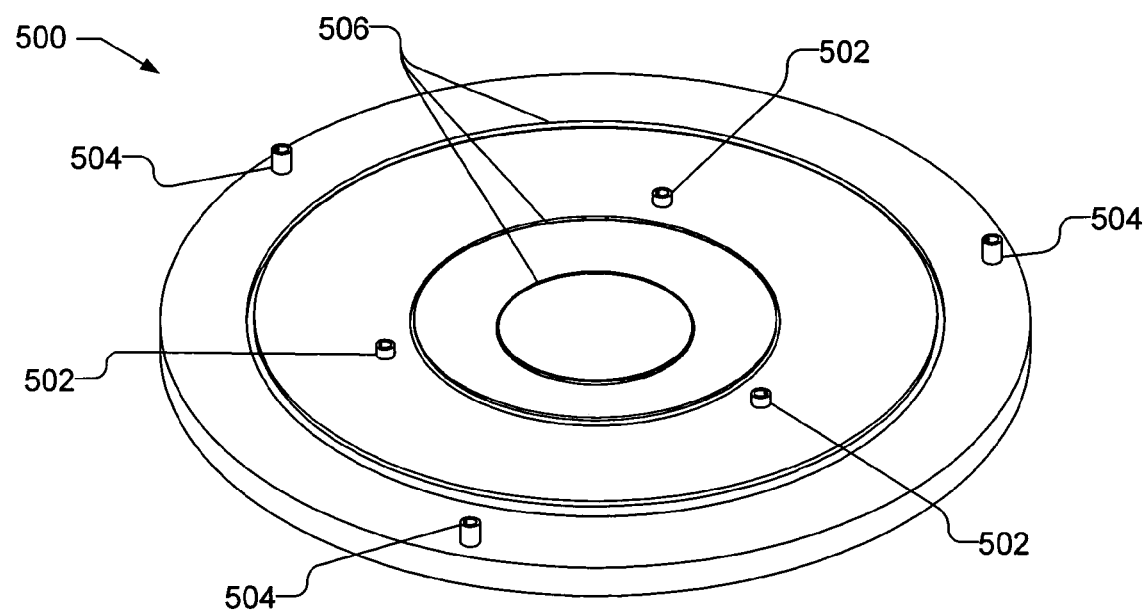
FIG. 20 shows a perspective view of a chuck with two sets of lift pins in accordance with another embodiment of the present invention.

In another embodiment, different sets of lift pins may be used for the buffer and the radius of curvature measurement. FIG. 20 shows a perspective view of a chuck 500 with two sets of lift pins. Chuck 500 includes a set of measurement lift pins 502, which are similar to lift pins 142 used for radius of curvature type measurements and a set of buffer lift pins 504. FIG. 20 also illustrates three circumferential vacuum channels 506 in chuck 500. By way of example, each set of lift pins 502 and 504 may include three lift pins. Both sets of lift pins 502 and 504 are shown in the raised position in FIG. 20. As illustrated in FIG. 20, the buffer lift pins 504 may extend higher than the measurement lift pins 502. By way of example, buffer lift pins 504 may rise approximately 10 mm above the surface of the chuck 500, while measurement lift pins 502 may rise approximately 1 mm above the surface of the chuck 500.

Figures 21A, 21B:
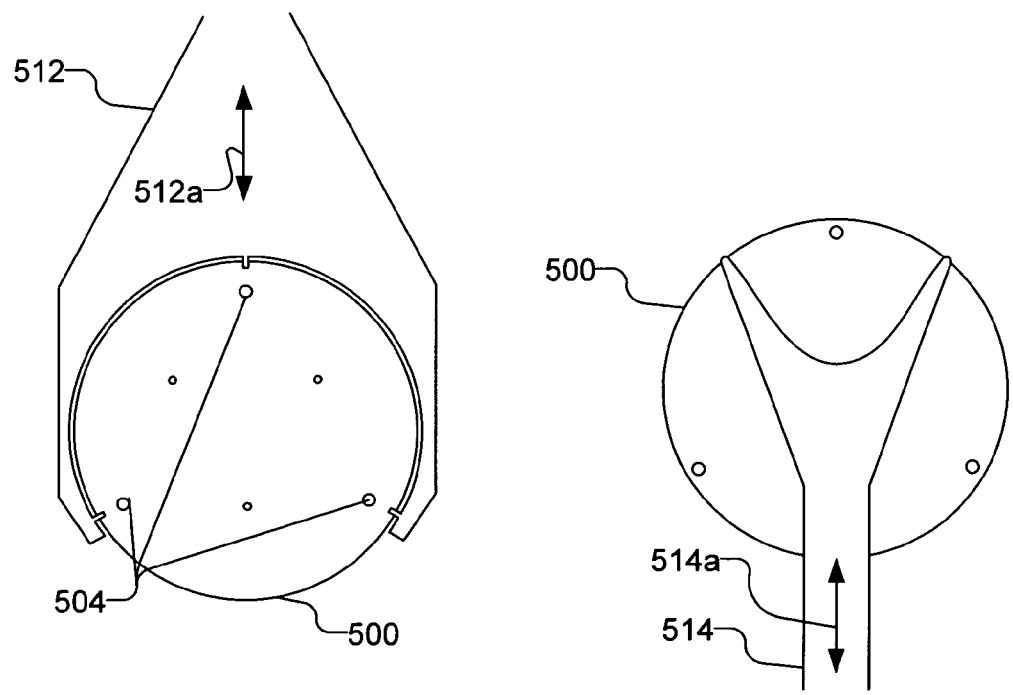
FIGS. 21A and 21B show top views of a chuck in relation to different types of substrate handling paddles.

The use of two sets of lift pins 502 and 504 is advantageous as one set of lift pins can be optimized for radius of curvature measurements, while the other set of lift pins is optimized for loading and unloading substrates from different types of paddles. For example, as discussed above, it is desirable for the measurement lift pins 502 to support a substrate at points that are approximately 30% to 60% of the radius of the substrate to minimize the influence of gravity on the bowing of the substrate. The buffer lift pins 504, on the other hand, are located near the outer diameter of the chuck 500 so that different types of paddles can be accommodated. FIGS. 21A and 21B show top views of chuck 500 in relation to a DNS Type I paddle 512 and a DNS Type II paddle 514, respectively, and their direction of motion, indicated by arrows 512a and 514a. As can be seen in FIGS. 21A and 21B, the buffer lift pins 504 are positioned so that either type of paddle 512 and 514 may be used with chuck 500.

Figure 22:
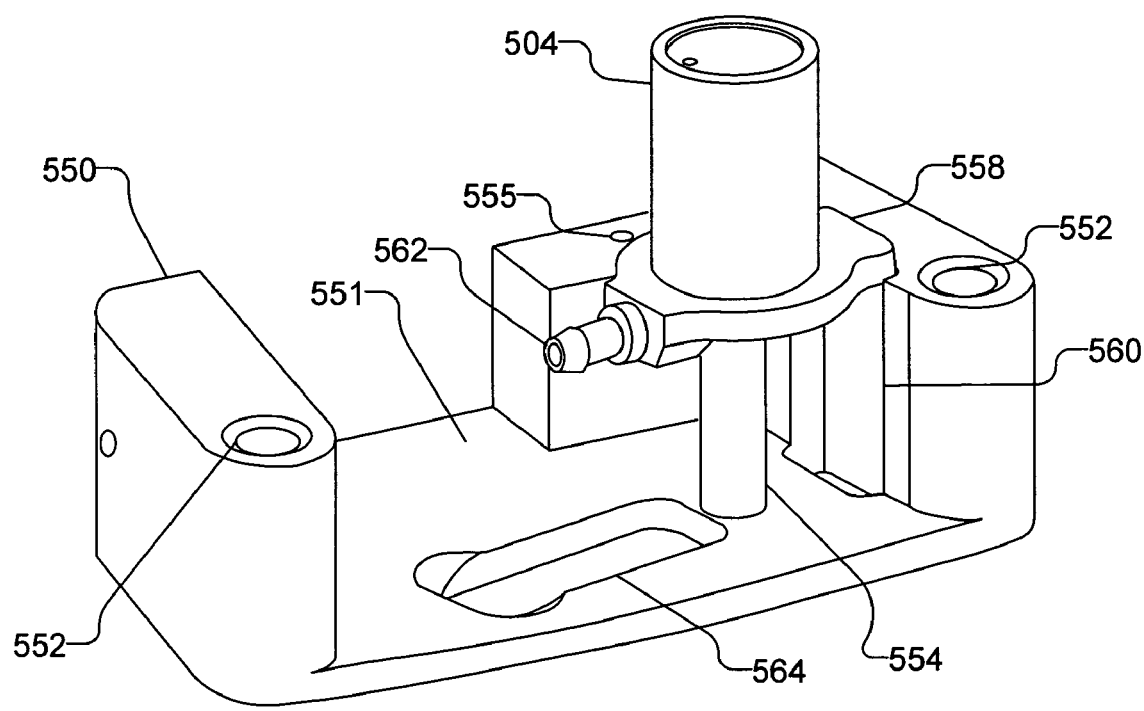
FIGS. 22 and 23 illustrate a perspective view and side view, respectively, of one embodiment of the lift pins.
Figure 23:
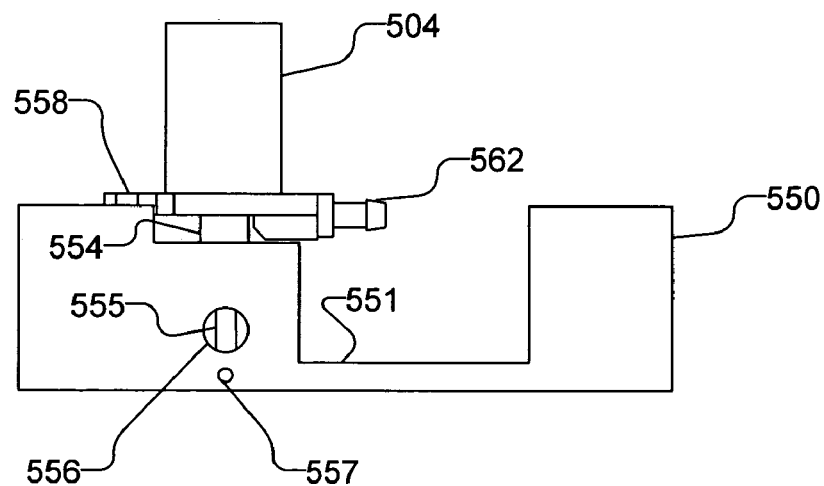

The buffer lift pins 504 may be similar to the lift pins 142 described above. Alternatively, the buffer lift pins 504 may be raised using pressurized air, as opposed to a vacuum. FIGS. 22 and 23 illustrate one embodiment of the buffer lift pins 504. FIGS. 22 and 23 show a perspective view and front view of a buffer lift pin 504, respectively. Buffer lift pin 504 is mounted on a base 550 that may be coupled to the chuck 500 by screws through apertures 552 or other appropriate mounting means. The buffer lift pin 504 is seated on a hollow post 554. Pressurized air is provided through the hollow post 554 to raise the buffer lift pin 504. The weight of the buffer lift pin 504 causes the buffer lift pin 504 to be lowered when the pressurized air is removed. Pressurized air may be provided, e.g., from the bottom 551 of the base 550 directly to the hollow post 554, or from an aperture 556 in the front of the base 550, as shown in FIG. 23. Where air is provided to the front of the base 550, the aperture 556 extends from the front of the base 550, through the bottom 551 of the base 550 to the hollow post 554. The aperture through the bottom 551 of the base 550 is shown as the aperture 557 in FIG. 23, which is sealed at the front end. The connecting aperture 555 between the aperture 556 and the aperture 557 through the bottom 551 of the base 550 is illustrated in FIG. 23. The connecting aperture 555 is sealed at the top end, as illustrated in FIG. 22.

As can be seen in FIG. 22, the buffer lift pin 504 includes a flange 558 that extends into a vertical groove 560 in the base 550. The flange 558 and groove 560 prevent the buffer lift pin 504 from rotating while being raised or lowered.

The buffer lift pin 504 includes an inlet 562 that is coupled a vacuum supply so that a vacuum may be applied to the top surface of lift pin 504, as described above in reference to FIG. 7. A hole 564 in the bottom 551 of the base 500 provides access for the conduit which provides the vacuum to inlet 562.

Although the present invention is illustrated in connection with specific embodiments for instructional purposes, the present invention is not limited thereto. Various adaptations and modifications may be made without departing from the scope of the invention. For example, if desired, the lift pins 142 may be similar to buffer lift pins 504. Moreover, additional or different components, focal systems, and metrology instruments may be used with the present invention. Therefore, the spirit and scope of the appended claims should not be limited to the foregoing description.

What is claimed is:

1. A method comprising:
   loading a substrate on a chuck;
   holding the substrate flat on a top surface of the chuck during a first type of measurement of the substrate; and
   raising a plurality of pins from the top surface of the chuck to raise the substrate on the plurality of pins during a second type of measurement of the substrate.

2. The method of claim 1, wherein the first type of measurement is a thickness measurement of at least one film on the substrate and the second type of measurement is a radius of curvature measurement of the substrate.

3. The method of claim 2, further comprising calculating the stress on the substrate using the results of the thickness measurement of the at least one film taken while the substrate is held flat on the chuck and of the radius of curvature measurement of the substrate taken while the substrate is raised on the plurality of pins.

4. The method of claim 3, further comprising:
   raising the substrate on a plurality of pins during a predeposition radius of curvature measurement of the substrate before the at least one film is deposited on the substrate;
   wherein calculating the stress on the substrate also uses the results from the predeposition radius of curvature measurement taken before the at least one film is deposited on the substrate.

5. The method of claim 1, wherein holding the substrate flat on a top surface of the chuck comprises providing a vacuum to the backside of the substrate through the top surface of the chuck.

6. The method of claim 5, wherein the top surface of the chuck comprises at least one channel, wherein the vacuum is applied to the backside of the substrate through the at least one channel.

7. The method of claim 1, further comprising:
applying a vacuum to the top surfaces of the plurality of pins before raising the plurality of pins to hold the substrate to the plurality of pins; and
removing the vacuum to the top surface of the plurality of the pins before performing the second type of measurement of the substrate.

8. The method of claim 7, wherein the second type of measurement of the substrate is performed at a plurality of locations on the substrate, the method further comprising:
applying a vacuum to the top surfaces of the plurality of pins;
moving the chuck to position the substrate at a new location for the second type of measurement;
removing the vacuum to the top surface of the plurality of the pins before performing the second type of measurement of the substrate at the new location; and
repeating the acts of applying the vacuum, moving the chuck, and removing the vacuum until all desired locations on the substrate have been measured with the second type of measurement.

9. The method of claim 8, wherein the second type of measurement of the substrate is a height measurement that is performed at the plurality of locations on the substrate, wherein the height measurements from the plurality of locations on the substrate is used to determine the radius of curvature of the substrate.

10. The method of claim 1, wherein the substrate is a first substrate and wherein loading a substrate on a chuck comprises:
raising the plurality of pins from the top surface of the chuck;
placing the first substrate on the plurality of pins;
lowering the plurality of pins to place the first substrate on the top surface of the chuck;
the method further comprising:
placing the first substrate on a stationary buffer after completing the first type and the second type of measurements of the substrate;
placing a second substrate on the plurality of pins; and
removing the first substrate from the buffer.

11. The method of claim 10 further comprising:
sensing the presence of the first substrate on the chuck; and
sensing the presence of the substrate on the stationary buffer.

12. The method of claim 1, wherein the substrate is a first substrate and wherein loading a substrate on a chuck comprises:
raising a second plurality of pins from the top surface of the chuck;
placing the first substrate on the second plurality of pins;
lowering the second plurality of pins to place the first substrate on the top surface of the chuck;
the method further comprising:
placing the first substrate on a buffer after completing the first type and the second type of measurements of the substrate;

placing a second substrate on the second plurality of pins; and
removing the first substrate from the buffer.

13. The method of claim 1, further comprising:
moving the chuck in a first direction; and
wherein loading a substrate on a chuck comprises loading the substrate on the chuck from a direction that is one of parallel or perpendicular to the first direction.

14. The method of claim 1, further comprising:
moving the chuck in a first direction; and
wherein loading a substrate on a chuck comprises loading the substrate on the chuck from second direction, the second direction is at a non-parallel and non-perpendicular angle to the first direction.

15. An apparatus comprising:
a chuck comprising:
a top surface;
a means for holding a substrate flat on the top surface of the chuck;
a plurality of pins that movably extend through the top surface of the chuck to raise a substrate off the top surface of the chuck;
at least one actuator coupled to the plurality of pins, the at least one actuator raises and lowers the plurality of pins through the top surface of the chuck; and
a metrology device that produces a first type of measurement of a substrate held flat on the top surface of the chuck and a second type of measurement of the substrate raised on the pins off the top surface of the chuck.

16. The apparatus of claim 15, wherein the at least one actuator is pneumatically controlled.

17. An apparatus comprising:
a chuck comprising:
a top surface;
a means for holding a substrate flat on the top surface of the chuck;
a plurality of pins that movably extend through the top surface of the chuck to raise a substrate off the top surface of the chuck;
at least one actuator coupled to the plurality of pins, the at least one actuator raises and lowers the plurality of pins through the top surface of the chuck; and
a buffer comprising a plurality of horizontal arms to hold a substrate, the horizontal arms being vertically positioned to hold a substrate higher than a substrate held on the plurality of pins when raised.

18. The apparatus of claim 17, further comprising:
a second plurality of pins that movably extend through the top surface of the chuck to receive a substrate being loaded by substrate handling paddle;
a second at least one actuator coupled to the second plurality of pins, the second at least one actuator raises and lowers the second plurality of pins through the top surface of the chuck;
wherein the buffer is vertically positioned to hold a substrate higher than a substrate held on the second plurality of pins when raised.

19. The apparatus of claim 17, further comprising a first sensor for detecting the presence of a substrate on the chuck and a second sensor for detecting the presence of a substrate on the buffer.

20. The apparatus of claim 19, wherein the first sensor and second sensor are through-beam sensors.

21. The apparatus of claim 17, wherein the chuck is movable in a first direction, wherein the horizontal arms are configured to permit a substrate to be loaded and unloaded in a second direction that is at a non-parallel and non-perpendicular angle to the first direction.

22. A method comprising:
  loading a substrate on a chuck having a top surface and a plurality of vertically movable pins;
  providing a vacuum to at least a portion of the backside of the substrate through the top surface of the chuck to hold the substrate flat on the top surface of the chuck;
  measuring the thickness of at least one film on the substrate while the substrate is held flat on the substrate;
  removing the vacuum to the at least a portion of the backside of the substrate through the top surface of the chuck;
  providing a vacuum to at least a portion of the backside of the substrate through the top surfaces of the plurality of pins;
  raising the plurality of pins to raise the substrate off the top surface of the chuck;
  removing the vacuum to the at least a portion of the backside of the substrate through the top surfaces of the plurality of pins; and
  measuring the radius of curvature of the substrate while the substrate is supported on the plurality of pins.

23. The method of claim 22, wherein measuring the radius of curvature of the substrate while the substrate is supported on the plurality of pins comprises measuring the height of the top surface of the substrate at a plurality of locations while the substrate is supported on the plurality of pins.

24. The method of claim 23, wherein measuring the height of the top surface of the substrate at a plurality of locations while the substrate is supported on the plurality of pins comprises:
  measuring the height of the top surface of the substrate at a first location on the substrate while the substrate is supported on the plurality of pins;
  reapplying the vacuum to the at least a portion of the backside of the substrate through the top surfaces of the plurality of pins;
  moving the chuck to position the substrate for a height measurement of the top surface of the substrate at the next location;
  removing the reapplied vacuum to the at least a portion of the backside of the substrate through the top surfaces of the plurality of pins;
  measuring the height of the top surface of the substrate at the next location on the substrate while the substrate is supported on the plurality of pins; and
  repeating the acts of reapplying the vacuum, moving the chuck, removing the reapplied vacuum, and measuring the height for the remaining plurality of locations.

25. The method of claim 24, further comprising measuring a predeposition radius of curvature of the substrate while the substrate is supported on the plurality of pins before the at least one film is deposited on the substrate.

26. The method of claim 22, wherein the substrate is a first substrate and wherein loading a substrate on a chuck comprises:
  raising the plurality of pins;
  placing the first substrate on the plurality of pins;
  providing a vacuum to at least a portion of the backside of the first substrate through the top surfaces of the plurality of pins;
  lowering the plurality of pins to place the first substrate on the top surface of the chuck;
  removing the vacuum to the at least a portion of the backside of the first substrate through the top surfaces of the plurality of pins;
the method further comprising:
  placing the first substrate on a buffer after measuring the thickness of at least one film on the substrate and measuring the radius of curvature of the substrate;
  placing a second substrate on the plurality of pins; and
  removing the first substrate from the buffer.

27. The method of claim 22, wherein the substrate is a first substrate and wherein loading a substrate on a chuck comprises:
  raising a second plurality of pins;
  placing the first substrate on the second plurality of pins;
  providing a vacuum to at least a portion of the backside of the first substrate through the top surfaces of the second plurality of pins;
  lowering the second plurality of pins to place the first substrate on the top surface of the chuck;
  removing the vacuum to the at least a portion of the backside of the first substrate through the top surfaces of the second plurality of pins;
the method further comprising:
  placing the first substrate on a buffer after measuring the thickness of at least one film on the substrate and measuring the radius of curvature of the substrate;
  placing a second substrate on the second plurality of pins; and
  removing the first substrate from the buffer.

28. The method of claim 27, further comprising:
  sensing the presence of the first substrate on the chuck; and
  sensing the presence of the substrate on the stationary buffer.

29. The method of claim 22, further comprising:
  moving the chuck in a first direction;
  wherein loading a substrate on a chuck comprises loading the substrate on the chuck from a direction that is one of parallel or perpendicular to the first direction.

30. The method of claim 22, further comprising:
  moving the chuck in a first direction; and
  wherein loading a substrate on a chuck comprises loading the substrate on the chuck from second direction, the second direction is at a non-parallel and non-perpendicular angle to the first direction.

* * * * *